(12) United States Patent
Verbaas et al.

(10) Patent No.: US 12,476,091 B2
(45) Date of Patent: Nov. 18, 2025

(54) ELECTROSTATIC CHUCK AND METHOD OF OPERATION FOR PLASMA PROCESSING

(71) Applicant: Tokyo Electron Limited, Tokyo (JP)

(72) Inventors: Melvin Verbaas, Austin, TX (US); Einosuke Tsuda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 209 days.

(21) Appl. No.: 18/136,276

(22) Filed: Apr. 18, 2023

(65) Prior Publication Data
US 2024/0355593 A1  Oct. 24, 2024

(51) Int. Cl.
| | | |
|---|---|---|
| *H01J 37/32* | (2006.01) | |
| *C23C 16/458* | (2006.01) | |
| *C23C 16/46* | (2006.01) | |
| *C23C 16/509* | (2006.01) | |
| *C23C 16/52* | (2006.01) | |

(Continued)

(52) U.S. Cl.
CPC .... *H01J 37/32715* (2013.01); *C23C 16/4583* (2013.01); *C23C 16/46* (2013.01); *C23C 16/509* (2013.01); *C23C 16/52* (2013.01); *H01J 37/32568* (2013.01); *H01L 21/3065* (2013.01); *H01L 21/6833* (2013.01); *H01J 37/32082* (2013.01); *H01J 2237/002* (2013.01); *H01J 2237/2007* (2013.01)

(58) Field of Classification Search
CPC .......... H01J 37/32715; H01J 37/32568; H01J 37/32082; H01J 2237/002; H01J 2237/2007; H01J 37/32724; C23C 16/4583; C23C 16/46; C23C 16/509; C23C 16/52; C23C 16/4586; C23C 16/505; H01L 21/3065; H01L 21/6833; H01L 21/67109
See application file for complete search history.

(56) References Cited

U.S. PATENT DOCUMENTS 8,277,673 B2 * 10/2012  Tsujimoto ........... H01L 21/6833
216/58
8,415,768 B1    4/2013  Golda et al.
(Continued)

FOREIGN PATENT DOCUMENTS

| EP | 0692814 A1 | 1/1996 |
|---|---|---|
| JP | 2017157855 A | 9/2017 |
| KR | 20230045894 A | 4/2023 |

OTHER PUBLICATIONS

International Search Report and Written Opinion, PCT/US2024/016624, mailed Jun. 20, 2024, Total pp. 10.

(Continued)

*Primary Examiner* — Anita K Alanko
(74) *Attorney, Agent, or Firm* — Slater Matsil, LLP

(57) ABSTRACT

An electrostatic chuck (ESC) for holding a workpiece in a plasma processing chamber, where the ESC includes a monolithic insulating substrate with a top surface; a plurality of electrodes embedded in the insulating substrate, the plurality of electrodes being in a multipolar configuration to receive multiple DC bias signals from a first power supply circuit; and a radio frequency (RF) electrode embedded in the insulating substrate, the plurality of electrodes being located between the top surface and the RF electrode, the RF electrode including a contact node configured to be coupled to a second power supply circuit configured to generate an RF signal.

14 Claims, 11 Drawing Sheets

(51) Int. Cl.
*H01L 21/3065* (2006.01)
*H01L 21/683* (2006.01)

(56) References Cited

U.S. PATENT DOCUMENTS

| | | |
|---|---|---|
| 2005/0041364 A1 | 2/2005 | Kellerman et al. |
| 2006/0011590 A1* | 1/2006 | Wiepking ......... H01J 37/32082 |
| | | 219/121.43 |
| 2011/0221145 A1 | 9/2011 | Akbas |
| 2017/0358431 A1 | 12/2017 | Dorf et al. |
| 2019/0088517 A1 | 3/2019 | Kosakai et al. |
| 2020/0048770 A1* | 2/2020 | Sakiyama ............. C23C 16/505 |
| 2020/0325578 A1 | 10/2020 | Gomm et al. |
| 2021/0175108 A1 | 6/2021 | Verbaas |
| 2022/0148903 A1 | 5/2022 | Wang et al. |
| 2022/0415629 A1* | 12/2022 | Koiwa .............. H01J 37/32568 |
| 2023/0100582 A1* | 3/2023 | Kim .................... H01L 21/6833 |
| | | 156/137 |
| 2023/0268165 A1* | 8/2023 | Aoki ................ H01J 37/32697 |
| | | 156/345.28 |
| 2024/0136161 A1* | 4/2024 | Leeser ................ H01L 21/6833 |

OTHER PUBLICATIONS

Qin, Shu, et al., "Wafer dependence of Johnsen-Rahbek type electrostatic chuck for semiconductor processes," Journal of Applied Physics 102, 064901, Sep. 17, 2007, 5 pages.

* cited by examiner

ELECTROSTATIC CHUCK AND METHOD OF OPERATION FOR PLASMA PROCESSING

TECHNICAL FIELD

The present invention relates generally to equipment and method for processing a workpiece, and, in particular embodiments, to an electrostatic chuck and method of operation for processing a workpiece using plasma.

BACKGROUND

An integrated circuit (IC) includes a network of electronic components in a monolithic structure formed by processing a semiconductor wafer through a series of patterning levels. At each level, layers of diverse materials may be deposited and patterned using lithography and etch techniques that transfer a pattern of actinic radiation to targeted layers. Many of the fabrication steps are plasma processes, where the wafer is held by an electrostatic chuck (ESC) on a platen in a plasma chamber. The ESC may include other functions such as powering the plasma and backside temperature control. Generally, a step-and-repeat printing technique is used that forms a matrix of IC units on each wafer at the end of the process flow. Enabled by advances in patterning, the component density in ICs is doubled at each technology node by shrinking feature sizes and using three-dimensional (3D) devices such as nanosheet transistors and vertical NAND (V-NAND) memory, thus reducing unit cost of the IC. But, stacking materials with mismatch in thermal expansion and forming 3D structures with sharp edges often result in high process-induced stress that causes wafer bow and warpage. This makes it challenging for the ESC to clamp the wafer with a desired flatness. Inadequate flatness may affect sidewall profiles of etched features, step coverage of a deposited film, and efficient backside temperature control of the wafer. Thus, further innovation in ESC technology suitable for advanced plasma processing is desired.

SUMMARY

An electrostatic chuck (ESC) for holding a workpiece in a plasma processing chamber, where the ESC includes a monolithic insulating substrate with a top surface; a plurality of electrodes embedded in the insulating substrate, the plurality of electrodes being in a multipolar configuration to receive multiple DC bias signals from a first power supply circuit; and a radio frequency (RF) electrode embedded in the insulating substrate, the plurality of electrodes being located between the top surface and the RF electrode, the RF electrode including a contact node configured to be coupled to a second power supply circuit configured to generate an RF signal.

An apparatus for plasma processing a workpiece, where the apparatus includes a plasma processing chamber mechanically coupled to a gas flow system configured to flow gas through the chamber; an electrostatic chuck (ESC) disposed in the chamber, the ESC including: a monolithic insulating substrate with a top surface; a plurality of electrodes embedded in the insulating substrate, in a multipolar configuration to receive multiple DC bias signals; and a radio frequency (RF) electrode embedded in the insulating substrate, the plurality of electrodes being located between the top surface and the RF electrode; a first power supply circuit configured to supply multiple DC bias signals to the plurality of electrodes, the plurality of electrodes being coupled to the first power supply circuit; and a second power supply circuit configured to supply an RF signal to the RF electrode, the RF electrode being coupled to a second power supply circuit.

A method for plasma processing a workpiece in a plasma processing chamber, where the method includes placing a workpiece on an electrostatic chuck (ESC) disposed in the chamber; coupling a first set of DC bias signals to a plurality of electrodes embedded in the ESC in a multipolar configuration, the first set clamping the workpiece to the ESC; after clamping the workpiece to the ESC, decoupling the first set of DC bias signals from the plurality of electrodes; within a time window after decoupling the first set of DC bias signals, coupling a radio frequency (RF) signal to an RF electrode embedded in the ESC, the RF signal powering plasma in the chamber; after powering plasma in the chamber, coupling a second set of DC bias signals to the plurality of electrodes, the second set holding the workpiece clamped to the ESC; processing the workpiece in the chamber for a processing time duration; and after processing the workpiece, coupling third set of DC bias signals to the plurality of electrodes, the third set releasing the workpiece from the ESC.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
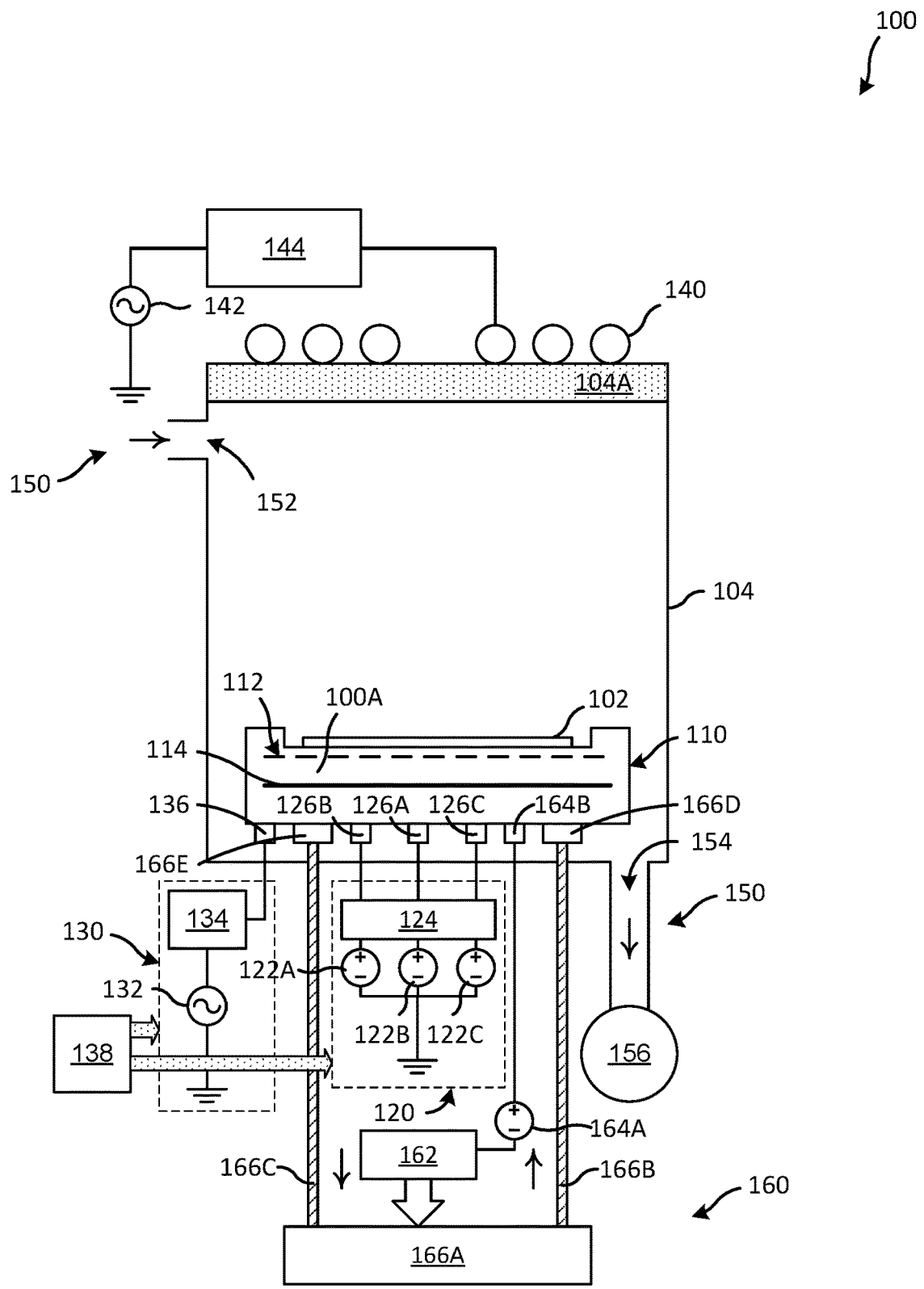
FIG. 1A illustrates a schematic of an apparatus for plasma processing a workpiece, in accordance with some embodiment.

This disclosure describes embodiments of an electrostatic chuck (ESC) having a monolithic insulating substrate in which a plurality of electrodes for generating electrostatic forces and a radio frequency (RF) electrode for generating electromagnetic (EM) fields are embedded. The plurality of electrodes are configured to receive DC bias signals, which are waveforms comprising high DC voltages. The DC bias signals create electric fields and induce charges to electrostatically clamp a workpiece flat over a surface of the ESC, grip the workpiece during a plasma process, and release the workpiece at the end of processing. The embodiments of ESCs described in this disclosure are designed for plasma processing apparatus, where the workpiece is held by the ESC in a plasma processing chamber in which gas discharge plasma is generated to process the workpiece in the chamber. In the examples described in this disclosure, the workpiece is a semiconductor wafer placed on the ESC, located inside the plasma processing chamber to electrostatically hold the wafer there using the plurality of electrodes. The RF electrode of the ESC is configured to receive an RF signal from an RF power source. The RF signal may be a continuous wave (CW) RF signal or a pulsed RF signal that generates oscillating EM fields in a narrow band centered around a high frequency of about 400 kHz to about 4 GHz. Generally, the EM fields are of sufficiently high magnitude to ionize gas, thus generate plasma over the ESC. The RF signal couples power to the charged particles (i.e., ions and free electrons) in the plasma in the chamber via the EM fields.

The substrate of the ESC comprises an insulator, while the plurality of electrodes and the RF electrode comprise conductors. The insulating and conductive materials may be selected to be heat resistant to extreme temperatures so that the ESC is operable over a wide temperature range (e.g., from −150° C. to 1000° C.). Ceramics, for example, quartz, boron nitride, alumina, zirconia, aluminum nitride, silicon carbide, and tungsten carbide are suitable materials for the substrate over the entire temperature range. For applications, where the temperature may not exceed, for example, 300° C., other insulators such as polyimide may be used as the substrate material. Likewise, in general, the electrodes may comprise most conductive materials, including metals, metal alloys, and metallic compounds but, for high temperature applications, heat resistant conductors, for example, tungsten, titanium, molybdenum, zirconium, hafnium, and nickel and their alloys, may be suitable.

The electrostatic clamping and gripping forces depend not only on the permittivity of the insulator material but also on its resistivity at an operating temperature. While insulators have a high resistivity, there is, invariably, a non-zero leakage current when a bias voltage is applied to the plurality of electrodes, where the leakage current increases rapidly with increasing temperature. Conduction of charge associated with the leakage current in the insulator may place charges very close to the surface over which the workpiece is placed. This increases a local electric field, hence the gripping force, significantly for the same applied voltage, a phenomenon known as the Johnsen Rahbek (JR) effect. The JR effect is a result of a surface charge distribution established with an RC time constant that is roughly proportional to the insulator resistivity. The time delay to establish the JR conditions may vary from seconds to hours, depending on the insulator resistivity at the temperature at which the ESC is operated. If the JR delay time is long (e.g., of the order of a processing time duration or longer) then there would be negligible unbalanced charge in the insulator, and the ESC is said to be of Coulomb type, where almost all the charge resides in the plurality of electrodes. If the JR delay time is short (e.g., of the order of one second) then the ESC is said to be of JR type. Because the RC time constant increases with resistivity, JR-type ESCs, generally, comprise insulators with resistivity between $10^8$ ohm-cm to $10^{16}$ ohm-cm, while ESCs comprising insulators with resistivity greater than $10^{16}$ ohm-cm are Coulomb-type ESCs. The gripping forces for JR-type ESCs are sometimes nonuniform and vary between wafers because of surface roughness and particles on the surface. Sometimes, in order to address such issues, a hybrid-JR ESC is used, where the surface of a lower resistivity insulator is coated with a high resistivity dielectric. The hybrid-JR ESC may provide a high grip force with the uniformity of a Coulomb-type ESC.

The inventive aspects of the embodiments of ESCs described in this disclosure stem from embedding the plurality of electrodes and the RF electrode simultaneously in the monolithic insulating substrate. Hence, the invented ESC and the invented plasma processing apparatus and methods using the invented ESC are applicable to the Coulomb, JR, and hybrid-JR types of ESCs.

The plurality of electrodes and the RF electrode may be embedded in the insulating substrate of the ESC in various ways to form a monolithic insulating substrate.

The electrodes may be embedded in an insulating substrate by, for example, a powder bed sintering process, where metallic components, such as the electrodes, electrical connectors (i.e., vias), and wire heating elements, are placed within layers of ceramic powder and co-sintered to form a structure comprising a monolithic insulating substrate embedded with metallic components. The metallic components such as the electrodes may be formed using preformed metal wire and laid in pattern.

A ceramic lamination technology, referred to as "greensheet technology" may be used to fabricate multiple levels of metal embedded in a monolithic insulating ceramic substrate. In greensheet technology, a first metal level is formed by obtaining a first stack of ceramic green sheets with pre-patterned via holes, forming a metal layer over the top of the first stack and in the via holes, and patterning the metal layer. The ceramic green sheets comprise a ceramic that has not been fired. Various ceramic materials, for example, aluminum oxide, copper oxide, titanium oxide, and aluminum nitride may be used. Often aluminum nitride provides an advantage by being one of the few materials that offer electrical insulation and high thermal conductivity. The metal layer may be formed by, for example, applying a refractory metal paste, or placing pre-formed metal wire and laid-in pattern. The first metal level (e.g., the RF electrode) may then be covered by a second stack of ceramic green sheets and a second metal level (e.g., the plurality of electrodes) may be formed using techniques similar to those used to form the first level. After completing forming the stacks, the ceramic may be fired.

Figure 1B:
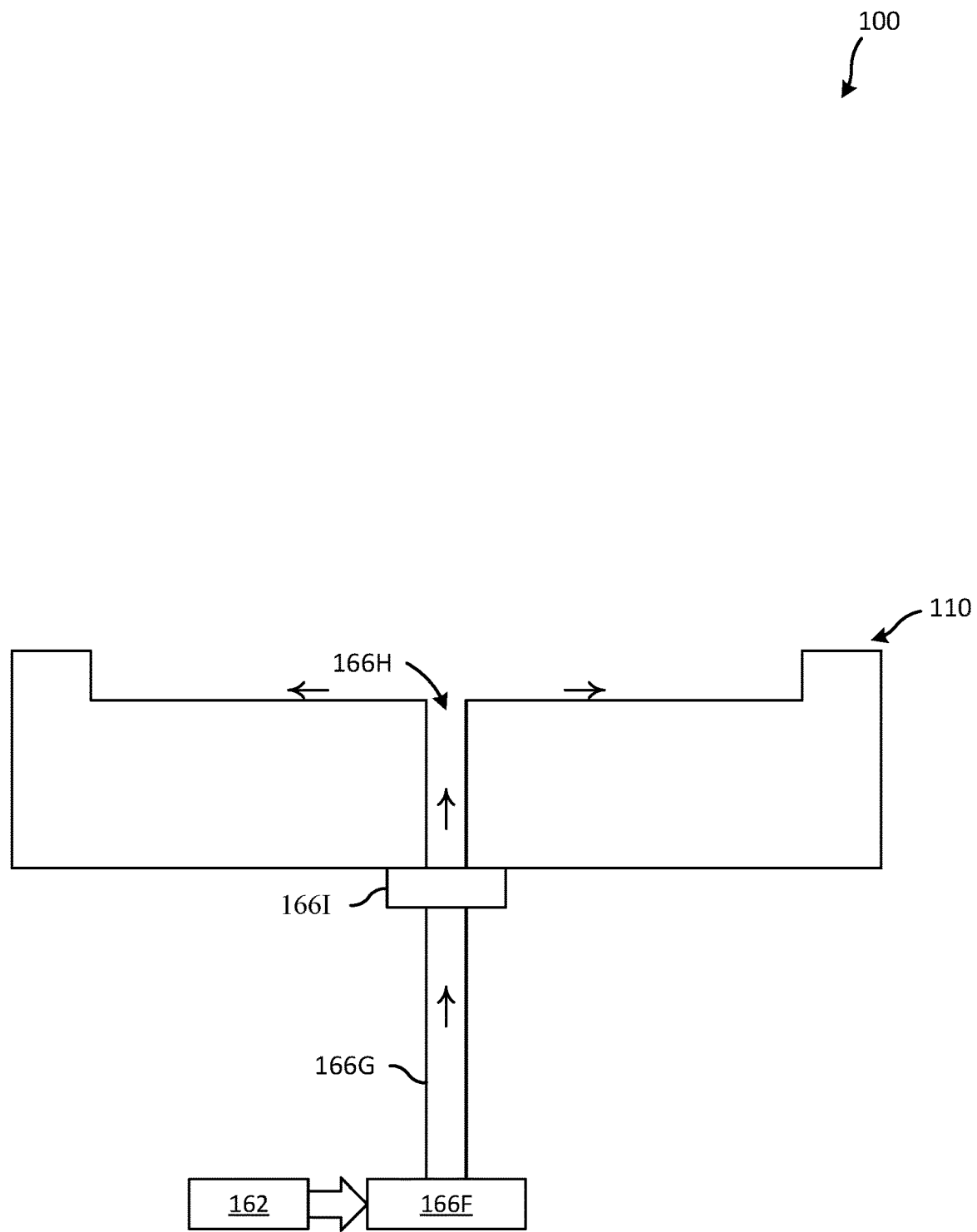
FIG. 1B illustrates a schematic diagram of a detail of the apparatus for plasma processing a workpiece illustrated in FIG. 1A.
Figure 3A:
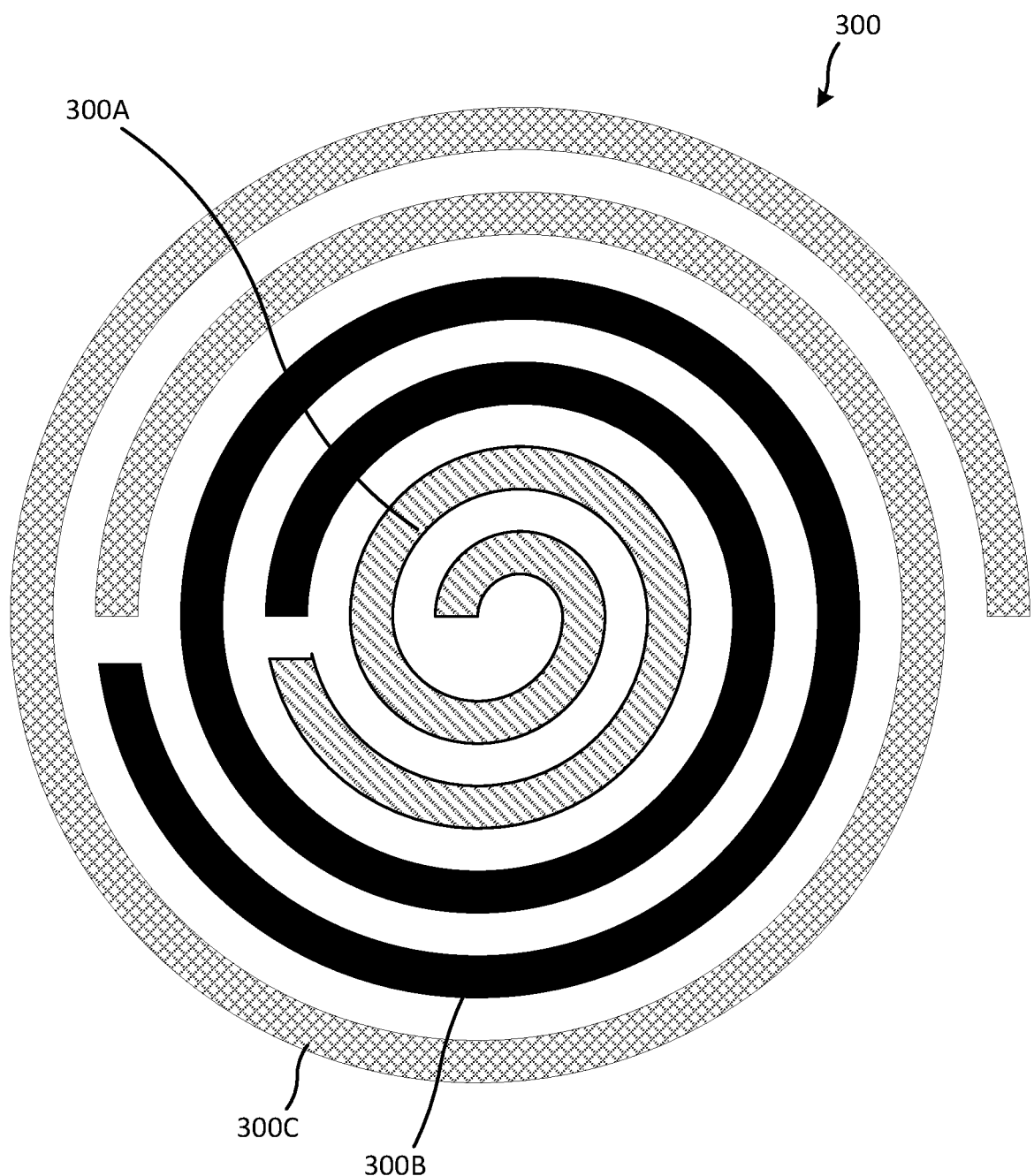
FIG. 3A illustrates a top view of one example of a plurality of electrodes in a multipolar configuration, in accordance with one embodiment.
Figure 3B:
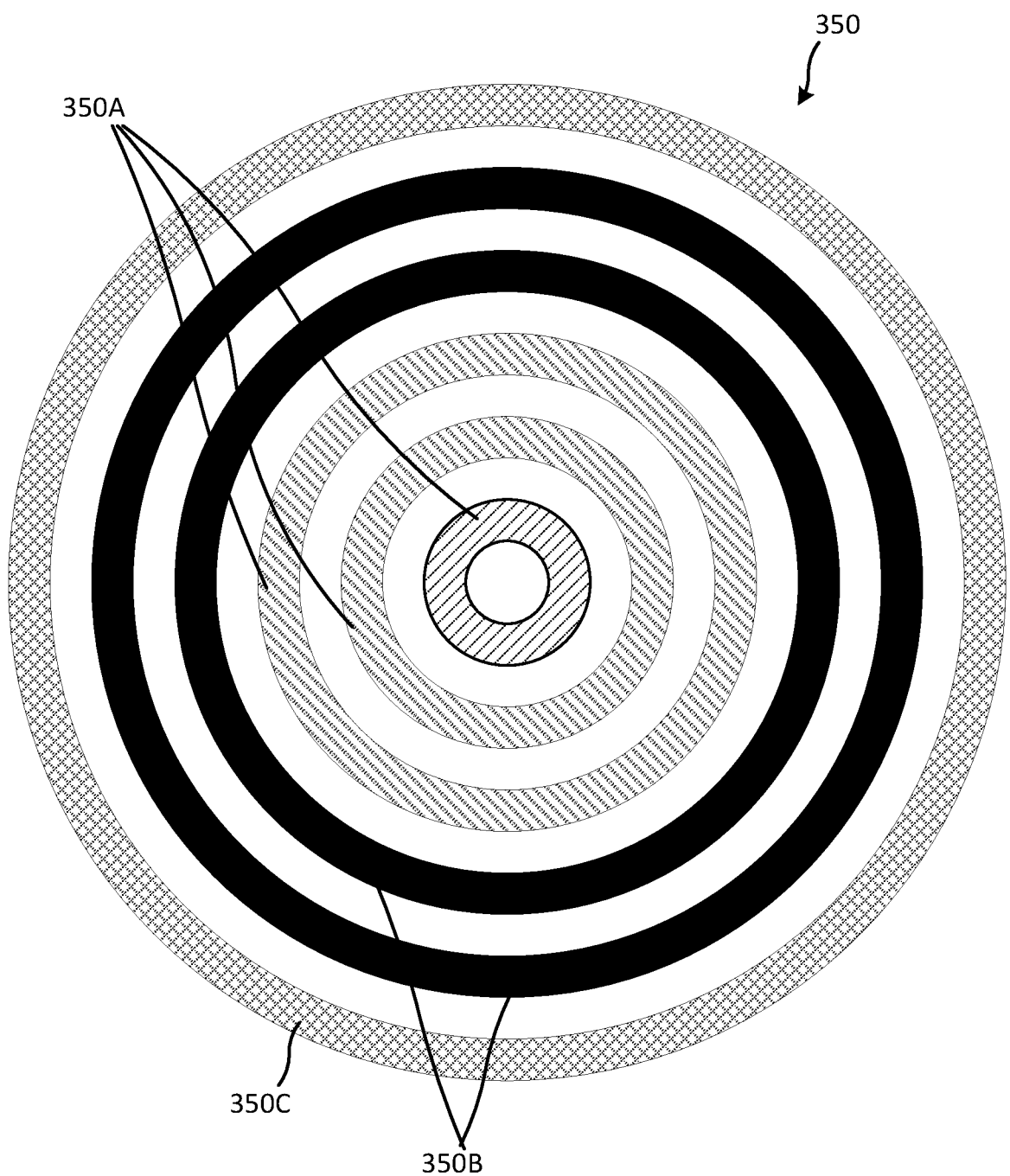
FIG. 3B illustrates a top view of another example of a plurality of electrodes in a multipolar configuration, in accordance with another embodiment.
Figure 4:
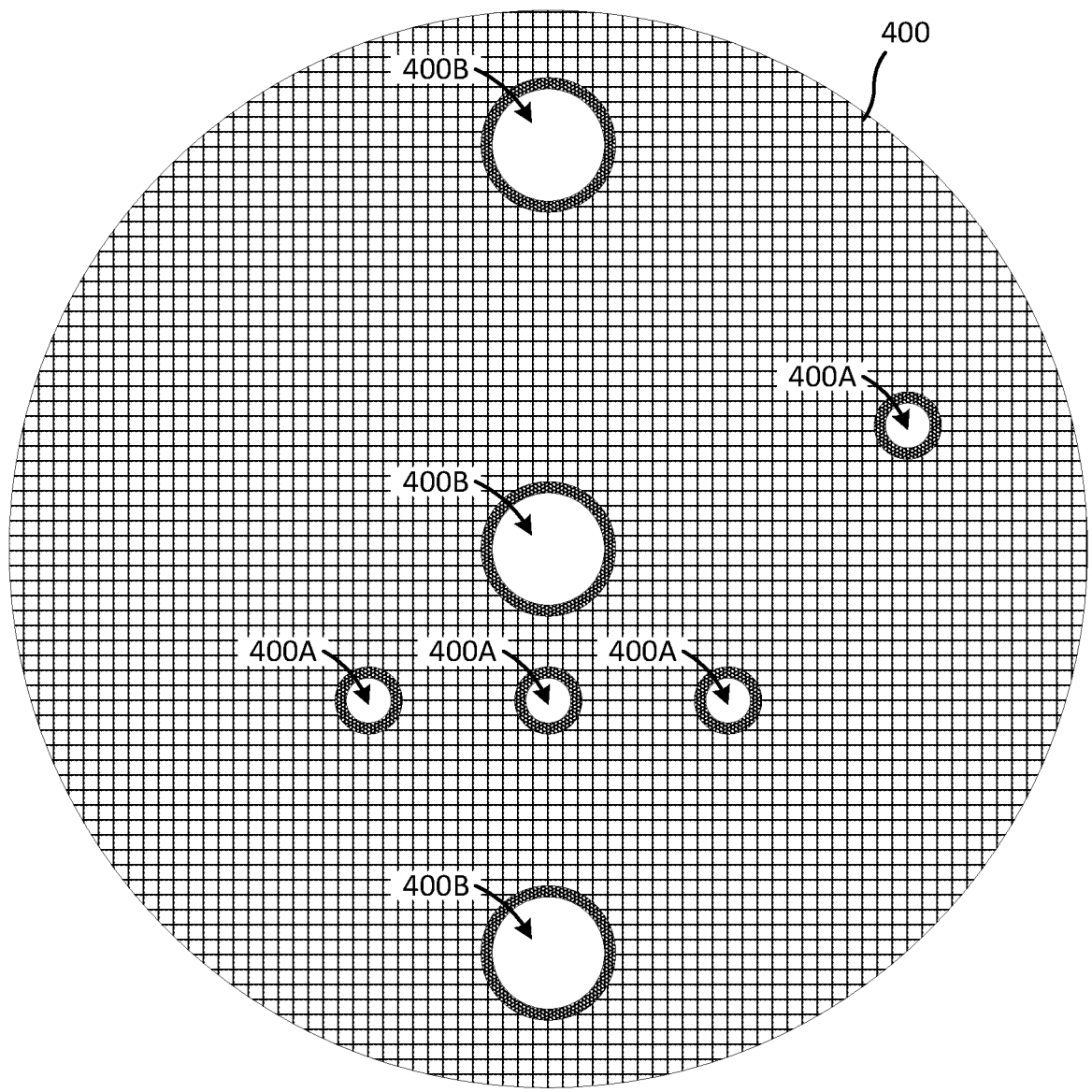
FIG. 4 illustrates a top view of a radio frequency (RF) electrode, in accordance with some embodiment.

An example of a plasma processing apparatus that includes an embodiment of the ESC having a monolithic substrate embedded with the plurality of electrodes and an RF electrode, as mentioned above) is described with reference to FIGS. 1A and 1B. In FIGS. 1A and 1B, the workpiece held by the ESC is a semiconductor wafer in a plasma processing chamber of the apparatus. The ESC is described in detail with reference to a cross-sectional view, illustrated in FIG. 2. FIGS. 3A-3B illustrate top views of two example designs for the plurality of electrodes, and FIG. 4 illustrates a top view of an example RF electrode having openings to flow fluid through the ESC for backside temperature control and feedthroughs for electrical connectors to the plurality of electrodes and for conductors coupled to a heater disposed in the ESC. A method of plasma processing a semiconductor wafer, including operating the invented ESC to hold the wafer in the plasma processing chamber is described with reference to a flowchart in FIG. 5 and cross-sectional views of the ESC at various stages of operation of the plasma processing apparatus, illustrated in FIGS. 6A-6D.

FIG. 1A shows a schematic of an example plasma processing apparatus 100 suitable for plasma processing a workpiece 102 held by an embodiment of the invented ESC 110 in a plasma processing chamber 104. The workpiece 102 is a semiconductor wafer, and the chamber 104 is a chamber suitable for performing a direct plasma process, i.e., an upper surface of the workpiece 102 is directly exposed to plasma generated in the chamber 104. The plasma process may be, for example, a plasma etch or a plasma-enhanced deposition process used in a process flow for semiconductor device fabrication. A backside of the workpiece 102 is in physical contact with a top surface of the ESC 110, which is thus the support surface for the workpiece 102.

In the example embodiment shown in FIG. 1A, the plurality of electrodes 112 is located at a first distance from the top surface of the ESC 110, as indicated by a dashed line in the ESC 110, and the RF electrode 114, indicated by a solid line in the ESC 110 is located at a second distance further away from the top surface. The plurality of electrodes 112 and the RF electrode 114 are both embedded in the insulating substrate. The plurality of electrodes 112, being used for clamping the workpiece 102, is disposed above the RF electrode 114, closer to the workpiece 102. In various embodiments, the first distance may be from about 0.5 mm to about 5 mm, and the second distance may be greater than the first distance by about 0.25 mm to about 10 cm. The spacing between the plurality of electrodes 112 and the RF electrode 114 may be used to accommodate other components as needed, for example, a heater and passageways for gas and/or liquid flowing through the ESC 110, as described in further detail below with reference to FIGS. 1B and 2.

Generally, the plurality of electrodes 112, located in a plane under the top surface of the ESC 110, extends laterally to span at least an area as wide as the workpiece 102 to ensure that the electrostatic forces holding the workpiece 102 during plasma processing are present over the entire extent of the workpiece 102 from its center to its edge. A lateral extent of the RF electrode 114 is similarly wide to minimize lateral nonuniformity of the EM fields in a region of the chamber 104 proximate the surface of the workpiece 102 being processed.

Generally, the ESC 110 is placed inside the chamber 104 on a support structure (not shown), often referred to as a pedestal because of its typical pedestal-like shape. In the example plasma processing apparatus 100, the pedestal may be, for example, a hollow ceramic (or ceramic coated) structure comprising a wide cylindrical upper portion physically connected to a hollow stem. The stem of the pedestal extends outside the chamber 104 through a floor of the chamber 104. The upper portion of the pedestal supports the ESC 110, and the stem of the pedestal provide a passage for various connections between the ESC 110 and equipment outside the chamber 104. For example, there may be wires and cables carrying electrical signals as well as pipes carrying liquid/gas coolants passing through the pedestal and accessing the ESC 110 through various feedthroughs in a bottom surface of the ESC110 (opposite the top surface).

In the examples described in this disclosure, the plurality of electrodes 112 is in a multipolar configuration for receiving multiple DC bias signals at DC terminals of the plurality of electrodes 112. The DC bias signals are transmitted from a first power supply circuit 120.

In the multipolar configuration, the plurality of electrodes 112 are grouped as a plurality of zones, where the number of zones is greater than one, typically two or three. As explained further below with reference to FIGS. 2, 3A and 3B, the electrodes of each zone may be physically located below a portion of the workpiece 102. For example, in an embodiment where the workpiece 102 is a semiconductor wafer, one zone may be proximate a central region of the wafer and another zone may be proximate an edge region of the wafer. The electrodes in each zone are electrically connected to be an equipotential and are electrically insulated from the electrodes in another zone. Each zone of the plurality of zones has a separate DC terminal which is configured to receive one of the multiple DC bias signals from the first power supply circuit 120. Thus, the multipolar configuration of the plurality of electrodes 112 allows for each zone to receive a respective DC bias signal.

Each DC bias signal (coupled to the respective DC terminal) may be a waveform comprising a single DC voltage level, multiple DC voltage levels, a time-varying voltage pulse (e.g., a linear ramp or a triangular waveform), an alternating voltage waveform (e.g., alternating between positive and negative voltages relative to a reference voltage or ground), or a combination thereof. In order to generate desired waveforms for the multiple DC bias signals, the first power supply circuit 120 may be comprising multiple waveform generators, for example, three waveform generators (shown as source-A 122A, source-B 122B, and source-C 122C in FIG. 1A). The waveform generators include circuitry for synthesizing high voltage waveforms such as rectifiers, filters, digital synthesizers, level shifters, DC amplifiers, and the like. Additionally, the first power supply circuit 120 includes a control circuit 124 that controls the relative timing of the multiple DC bias signals and the various voltage levels output by the waveform generators. The control circuit 124 may comprise, for example, switches (e.g., solid-state relays) operated by a microcontroller.

In general, the number of DC bias signals is equal to the number of zones. For the sake of specificity, we select the number of zones to be three for the example plurality of electrodes 112 illustrated in FIG. 1A. Accordingly, a set of three DC bias signals is generated by the first power supply circuit 120 and tailored by the control circuit 124 to have the correct timing and shape. The tailored DC bias signals may be connected by switches of the control circuit 124 to three respective output ports of the first power supply circuit 120 to be delivered to three DC terminals (not shown) in the ESC 110 via three electrical feedthroughs 126A, 126B, and 126C in the bottom surface of the ESC 110, as illustrated in FIG. 1A. However, it is noted that the operation of the first power supply circuit 120, including the control circuit 124, is controlled by a controller 138. As explained further below, the operation of a second power supply circuit 130 that generates the RF signal for the RF electrode 114 has to be synchronized with the operation of the first power supply circuit 120. The synchronized operation of first power supply circuit 120 and the second power supply circuit 130 is controlled by control signals from the controller 138.

The signals in a set of DC bias signals may be same or different. Consider, for example, an embodiment, where, after the workpiece 102 is initially placed on the ESC 110, the first power supply circuit 120 outputs three sets of DC bias signals: a first set of DC bias signals for clamping the workpiece 102 to the ESC 110, a second set of DC bias signals to hold the workpiece 102 clamped to the ESC 110 during plasma processing, and a third set of DC bias signals for releasing the workpiece 102 from the ESC 110. All the DC bias signals in the second set may be identical, where each signal, for example, is a voltage level present continuously for a fixed time interval, thus applying electrostatic force in all the zones to hold the workpiece 102 in place during plasma processing. It is noted that, operating an ESC having a plurality of electrodes (e.g., the ESC 110) by applying identical DC bias signals to all the zones implies that all the zones are at the same electric potential. This is equivalent to operating the ESC with a plurality of electrodes in a monopolar configuration because, in a monopolar configuration, the plurality of electrodes would be electrically shorted to be an equipotential. In contrast, if the incoming workpiece 102 is a semiconductor wafer bent concavely upward then each of the DC bias signals in the first set may be, for example, a DC pulse of different width, where a voltage level is applied with a different time delay such that the clamping process starts from a central region and proceeds outward to an edge region. Furthermore, the voltage levels may be different for the different DC bias signals in the first set of DC bias signals such that greater force is applied at the edge relative to that at the center of the workpiece 102. Likewise, the DC bias signals in the third set of DC bias signals may be timed individually to "declamp" the workpiece 102 in a reverse sequence, that is, release the workpiece 102 starting from the edge region inward to the central region.

As mentioned above, in addition to the plurality of electrodes 112, the RF electrode 114 is embedded in the insulating substrate of the ESC 110 at a location below the plurality of electrodes 112. The RF electrode is configured to receive an RF signal (e.g., a CW RF signal or a pulsed RF signal) at an RF terminal (not shown) of the RF electrode 114 in the ESC 110. As described above, when coupled to the RF signal, the RF electrode 114 is configured to power plasma in the plasma processing chamber 104. The RF electrode 114, described in further detail with reference to FIG. 4, is typically shaped like a planar disk having a diameter greater than or equal to that of the workpiece 102. Unlike the plurality of electrodes, the RF electrode 114 conducts relatively high current since it provides power to plasma. Thus, in order to avoid excessive Joule heating, the RF electrode 114 may be using a thicker conductor than that used for each electrode of the plurality of electrodes 112. In various embodiments, the thicknesses may be from about 10 microns to about 1 mm.

In FIG. 1A, the RF signal received by the RF electrode 114 is supplied by the second power supply circuit 130. The second power supply circuit 130 comprises an RF power source 132 and a tunable impedance matching network 134, shown schematically in FIG. 1A. Generally, the RF power source 132 comprises an RF oscillator coupled to an RF power amplifier. Additional electronics such as a chopper circuit may be included to generate a pulsed RF signal. The output of the RF power source 132 is routed through the matching network 134 and coupled to the RF electrode 114. Generally, the matching network 134 is a network of inductors and capacitors having at least one adjustable circuit element to tune a frequency-dependent impedance of the matching network 134. The impedance of the matching network 134 is tuned to match an output impedance of the RF power amplifier to a load impedance at an output of the second power supply circuit 130 to achieve maximum power transfer and suppress unwanted reflections. The load impedance comprises a combined impedance of components coupled to an output port of the second power supply circuit 130 such as a coaxial transmission line, the RF electrode 114 (including the impedance of the plasma coupled to the RF electrode 114). As illustrated in FIG. 1A, the RF signal from the second power supply circuit 130 may be passed into the ESC 110 through an RF feedthrough 136 in the bottom surface of the ESC 110 to be coupled to the RF electrode 114.

A method for plasma processing the workpiece 102 includes operating the ESC 110. In this method, biasing of the plurality of electrodes 112 and coupling RF-power to the RF electrode 114 are performed synchronously. The controller 138 may synchronously operate the first power supply circuit 120 and the second power supply circuit 130, as indicated schematically by two block arrows in FIG. 1A. For example, the controller 138 may send synchronized control signals to switches (e.g., solid-state relays) in the first power supply circuit 120 and the second power supply circuit 130 that engage the DC bias signals to the output ports of the first power supply circuit 120 and the RF signal to the output port of the second power supply circuit 130, respectively. (The method for plasma processing the workpiece 102, including operating the ESC 110, is described in detail further below with reference to FIG. 5 and FIGS. 6A-6D.)

In some embodiments, such as the example plasma processing apparatus 100, there may be a separate RF electrode 140 disposed outside the ESC 110. In FIG. 1A, the separate RF electrode 140 is an antenna shaped like a planar coil, shown located outside the chamber 104 over a ceiling 104A of the chamber 104. The separate RF electrode 140 functions as a power coupler configured to couple RF power to power plasma in the chamber 104. This configuration, where RF power from an antenna outside a plasma chamber is coupled to plasma inside the plasma chamber, is referred to as an inductively coupled plasma (ICP) configuration. In an ICP configuration, conductive material may be avoided in the region between the antenna and plasma in order to avoid shielding EM fields generated at the antenna. Accordingly, the ceiling 104A in FIG. 1A may comprise a dielectric such as quartz.

In some other embodiment, the separate RF electrode may be disposed inside the chamber, for example, a disk-shaped electrode in an upper region of the chamber 104. The disk-shaped separate RF electrode may function as a power coupler by capacitively coupling RF power to plasma in the chamber 104. Hence, such a configuration is referred to as a capacitively coupled plasma (CCP) configuration.

As illustrated in FIG. 1A, the separate RF electrode 140 is configured to receive power from a separate RF power source 142 via a separate matching network 144 for efficient coupling and to suppress undesired reflected power. The RF frequency of an RF signal generated by the separate RF power source 142 may differ from the RF frequency of the RF signal output by the second power supply circuit 130. Hence, the separate matching network 144 is tuned accordingly.

Every embodiment of the ESC 110 described in this disclosure has the plurality of electrodes 112 and the RF electrode 114 embedded in the insulating substrate. Since the RF electrode 114 is configured to couple RF power to gas discharge plasma while holding the workpiece 102, it is understood that the workpiece 102 would be processed using a direct plasma process. Accordingly, the plasma processing chamber 104, in which the ESC 110 is located, is coupled to a gas flow system 150, configured to flow a discharge gas through the chamber 104. The gas flow system 150 includes all components involved in the flow of gas through the chamber 104. As illustrated in FIG. 1A, such components include a gas inlet 152, a gas outlet 154, and a vacuum pump 156 coupled to the gas outlet 154 to pump gas out of the chamber 104. Other components of the gas flow system 150 may include gas canisters, flow lines, throttle valves, gas flow sensors and controllers, and the like. Although one gas inlet 152 is shown in a sidewall of the chamber 104, it is understood that there may be multiple gas inlets and various types of gas inlet designs (e.g., a showerhead in the ceiling 104A of the chamber 104). Likewise, although one gas outlet 154 is shown in the floor of the chamber 104, it is understood that there may be multiple gas outlets.

The discharge gas, introduced in the chamber 104 through the gas inlet 152, may be a gaseous mixture comprising reactants, diluents, and additives. The gas pumped out through the gas outlet 154 may further include volatile byproducts produced in the chamber 104 during processing. Inside the chamber 104, gas is directed to flow from the gas inlet 152, over the workpiece 102, and out through the gas outlet 154.

The example plasma processing apparatus 100, illustrated in FIG. 1, further includes a thermal system 160 coupled to the ESC 110 to control a temperature of the workpiece 102 from its backside, the side of the workpiece 102 in contact with the top surface of the ESC 110. The thermal system 160 comprises components for heating and cooling the ESC 110 and for maintaining good thermal contact between the workpiece 102 and the top surface of the ESC 110 in order to achieve efficient and accurate backside temperature control of the workpiece 102. A temperature sensor (typically located in the ESC 110) and a temperature controller 162 are included in the thermal system 160. The temperature controller 162, based on a signal from the temperature sensor, may control operation of the various elements of the thermal system 160 in order to control the temperature of the workpiece 102. In FIG. 1A, the temperature controller 162 is shown coupled to a heater power supply 164A and a cooler 166A.

The heater power supply 164A may be a variable power source (e.g., a variable DC voltage source) configured to power a heater disposed in the ESC 110. As illustrated schematically in FIG. 1A, an output voltage (e.g., a DC voltage level) of the heater power supply 164A may be provided to a terminal inside the ESC 110 through another electrical feedthrough 164B, similar to the electrical feedthroughs 126A, 126B, and 126C.

The cooler 166A is configured to chill a coolant to a controlled chill temperature and circulate the coolant through coolant passageways in the ESC 110 at a controlled flow rate. (The heater and the coolant passageways for the coolant in the ESC 110 are shown schematically in FIG. 2.) The coolant may be a liquid coolant comprising, for example, water or deionized water (DI-water). Often an anti-freeze agent such as ethylene glycol, is added to the liquid coolant. As illustrated in FIG. 1A, the cooler 166A may be configured to pump the chilled coolant along a coolant supply pipe 166B to a coolant feedthrough 166D in the bottom surface of the ESC 110. The coolant feedthrough 166D is coupled to a coolant passageway inside the ESC 110. The coolant passageways in the example ESC 110 are channels for liquid flow to circulate the chilled coolant received from the coolant supply pipe 166B. These channels are configured to function as a heat exchanger, where the ESC 110 is cooled by transferring heat to the coolant. The heated coolant exits the ESC 110 via another coolant feedthrough 166E (similar to the coolant feedthrough 166D) to a coolant collection pipe 166C. The coolant collection pipe 166C returns the hot coolant to the cooler 166A to be chilled again to the chill temperature and recirculated via the coolant supply pipe 166B.

In addition to the heater, cooler 166A, and associated components, the thermal system 160 may comprise equipment (shown schematically in FIG. 1B) for flowing a backside gas through gaps between the backside of the workpiece 102 and its support surface, which is the top surface of the ESC 110. Formation of the gaps is described further below. The backside gas is a heat transfer medium comprising, for example, an inert gas, such as helium or argon, to improve heat transfer between the ESC 110 and the workpiece 102. Components of the plasma processing apparatus 100, shown in FIG. 1A but are not related to the backside gas flow, are omitted from FIG. 1B for the sake of clarity. The workpiece 102 is also not shown in FIG. 1B to show its support surface (the top surface of the ESC 110).

As illustrated in FIG. 1B, a backside gas supply 166F may be configured to force the backside gas to flow into a backside gas pipe 166G coupled to an outlet of the backside gas supply 166F. Operation of the backside gas supply 166F may be controlled by the thermal controller 162, as indicated by a block arrow in FIG. 1B. The backside gas pipe 166G passes through the stem and upper portion of the pedestal (not shown) and connects to a gas passageway 166H in the ESC 110 via a gas feedthrough 166I. The gas passageway 166H is a conduit for conveying backside gas from the gas feedthrough 166I through the body of the ESC 110 to the top surface of the ESC 110. The gas flow of the backside gas is indicated by several arrows in FIG. 1B.

Generally, if a backside gas is used to augment the thermal contact between the backside of the workpiece 102 and its support surface (the top surface of the ESC 110) then the top surface of the ESC 110 is textured to form a plurality of gaps between the two surfaces to facilitate distribution of the backside gas. The plurality of gaps creates space for the heat transfer gas to flow into under pressure and be in good thermal contact with the backside of the workpiece 102, typically, the semiconductor wafer. The plurality of gaps may be formed by various methods during fabrication of the ESC 110, for example, bead blasting the top surface of the ESC 110 to form indentations, embossing a pattern of grooves in the ceramic, etching a pattern comprising a plurality of micro mesas using lithography techniques, or a combination thereof.

The temperature controller 162 may comprise a microcontroller and memory to store instructions for the microcontroller to generate control signals to operate the components of the thermal system 160, based on temperature data received by the temperature controller 162 from the thermal sensor. In the plasma processing apparatus 100 described with reference to FIGS. 1A and 1B, the control signals from the temperature controller 162 may control, for example, the output voltage of the heater power supply 164A, the chill temperature and flow rate of the coolant for the cooler 166A, and/or a pressure or a flow rate of the backside gas by controlling the operation of the backside gas supply 166F.

Figure 2:
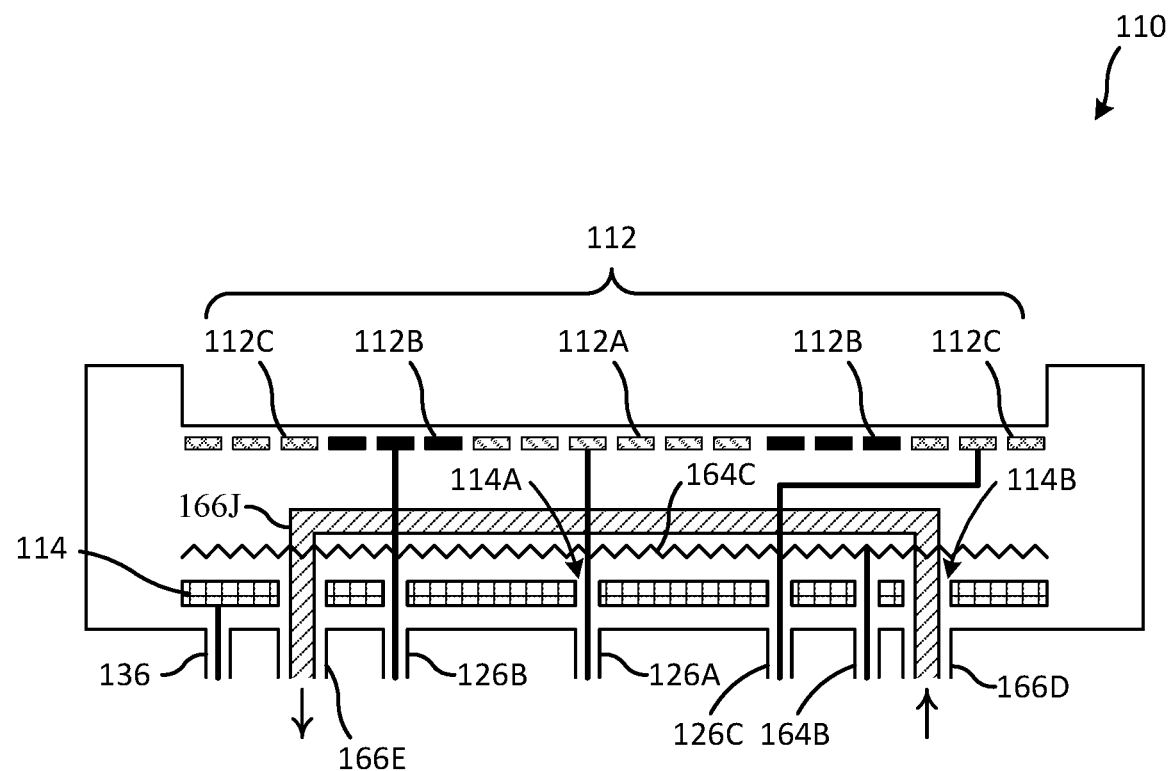
FIG. 2 illustrates a cross-sectional view of an electrostatic chuck for holding a workpiece in a plasma processing chamber, in accordance with some embodiment.

FIG. 2 illustrates the ESC 110 in a more detailed cross-sectional view than the view illustrated in FIG. 1A. The gas feedthrough 166I and the gas passageway 166H, shown in FIG. 1B are omitted from FIG. 2 for clarity.

As mentioned above, in the example ESC 110, the plurality of electrodes 112 is in a multipolar configuration with three zones (for the sake of specificity). The three zones are indicated in the cross-sectional view in FIG. 2 by three different fill patterns. As illustrated in FIG. 2, a first group of electrodes in a central region of the support surface forms a central zone 112A, a second group forms an intermediate zone 112B, and a third group forms an edge zone 112C. The first group of electrodes (the central zone 112A) is shown connected to an electrical connector exiting the ESC 110 through the electrical feedthrough 126A in bottom surface of the ESC 110 to be coupled to an output port of the first power supply circuit 120 that may be configured to transmit a DC bias signal generated by source-A 122A (see FIG. 1A).

Likewise, the first power supply circuit 120 has an output port for source-B 122B and another for source-C 122C.

As also mentioned above, the RF electrode 114 is intervening between the plurality of electrodes 112 and the feedthroughs in the bottom surface of the ESC 110 (such as the electrical feedthrough 126A). The RF electrode 114 is typically (and in a top view of an example RF electrode 400 illustrated in FIG. 4) a planar disk-shaped conductor spanning a major portion of a horizontal plane inside the ESC 110, except for a ring-shaped space separating the RF electrode 114 from sidewalls of the ESC 110. Thus, an insulated feedthrough 114A may be formed in the RF electrode 114 to allow the electrical connector from the central zone 112A to pass through to access the electrical feedthrough 126A in the bottom surface of the ESC 110. The second and third group of electrodes of the intermediate zone 112B and the edge zone 112C are similarly coupled to respective output ports of the first power supply circuit 120 by electrical connectors passing through the RF electrode 114 and the electrical feedthroughs 126B and 126C.

Although the electrodes of all the zones (the central zone 112A, the intermediate zone 112B, and the edge zone 112C) of the plurality of electrodes 112 in FIG. 2 are shown as co-planar in the example embodiment of the ESC 110 in FIG. 2, it is understood that, in some other embodiment, the plurality of electrodes may not be located in a single plane at a fixed distance from the top surface.

In addition to the plurality of electrodes 112 and the RF electrode 114, FIG. 2 schematically illustrates the heater 164C and coolant passageways 166J in the ESC 110. The coolant passageways 166J are for the liquid coolant from the cooler 166A (see FIG. 1A) to flow through the ESC 110. The heating element of the heater 164C, powered by the heater power supply 164A, may be, for example, a coiled heater wire or an etched conductive film. Examples of suitable conductive materials include tungsten, tungsten carbide, molybdenum, and nickel. In some embodiments, polyimide heating elements may be used. A polyimide heating element may be constructed of a thin etched-foil circuit laminated between two lightweight polyimide films. Although the heater 164C and the coolant passageways 166J are shown schematically in FIG. 2, it is understood that they have to be in thermal contact over a broad area of the insulating substrate for efficient heat exchange between the insulating substrate of the ESC 110 and a hot surface of the heater 164C or a cool surface of the coolant passageways 166J. This may be achieved by, for example, distributing the coolant passageways 166J in a portion of a plane inside the ESC 110. Likewise, the heating element of the heater 164C may be distributed in a planar pattern, for example, a zig-zag or a spiral pattern.

FIGS. 3A and 3B illustrate top views of two example designs of plurality of electrodes in a multipolar configuration having a central zone, an intermediate zone, and an edge zone. The top view in FIG. 3A shows the central zone 300A, the intermediate zone 300B, and the edge zone 300C having one spiral electrode each for a total of three spiral electrodes in the plurality of electrodes 300. FIG. 3B illustrates a top view of another plurality of electrodes 350 designed as a concentric arrangement of six circular electrodes. As illustrated in FIG. 3B, the central zone 350A of the plurality of electrodes 350 has three circular electrodes, the intermediate zone 350B has two circular electrodes, and the edge zone 350C has one circular electrode. Although it is not shown in FIG. 3B, the circular electrodes in the same zone are connected to ensure that each zone is an equipotential (as mentioned above).

FIG. 4 illustrates a top view of an RF electrode 400 that may be embedded in embodiments of the invented ESC (e.g., ESC 110). The RF electrode 400 is a typical disk-shaped electrode comprising a heat-resistant conductive material, such as tungsten, titanium, molybdenum, zirconium, hafnium, and nickel and their alloys, similar to the materials used for the plurality of electrodes 112, 300, and 350 (illustrated in FIGS. 1A, 1B, 3A, and 3B). As explained above, because RF electrodes may carry high RF current, the conductor thickness may be increased to avoid excessive Joule heating. In some embodiments of the ESC 110, there may be a sufficiently large mismatch between a coefficient of thermal expansion (CTE) of the material of the insulating substrate and the CTE of the conductive material of the RF electrode (e.g., the RF electrode 400) that may result in excessive mechanical stress at a high temperature. Since it is expected that, when heated, a solid disk-shaped conductor embedded in the insulating substrate would be strained more than a disk-shaped conductive mesh, some embodiments may use a conductive mesh as the RF electrode 400 if the ESC 110 is intended to operate at extreme temperatures.

The lateral extent of the RF electrode 400 may exceed that of the workpiece 102 to minimize lateral nonuniformity of the EM fields over the surface of the workpiece 102 being processed. As explained above, because the RF electrode 400 has a wide span, feedthroughs in the RF electrode 400 are fabricated to allow electrical connectors, and passageways for fluid flow. Electrical connectors that carry, for example, the three DC bias signals to the plurality of electrodes 112 (see FIG. 2) and electric power to the heater 164C (see FIG. 2) may go through four insulated feedthroughs 400A. In addition, the example RF electrode 400 in FIG. 4 has three fluid feedthroughs 400B. The fluid feedthrough 400B in the center may be used, for example, as part of the gas passageway 166H (see FIG. 1B) for the backside gas to flow through the ESC 110, and the two fluid feedthroughs 400B near the periphery may be used for the liquid coolant to circulate through the coolant passageways 166J.

An example method 500 for plasma processing a workpiece held in a plasma processing chamber 104 by the ESC 110 is described with reference to a flowchart illustrated in FIG. 5. Operation of the ESC 110, in the method 500, is explained with reference to cross-sectional views of the ESC 110, illustrated in FIGS. 6A-6D. The plasma processing apparatus, used in the method 500, is similar to the plasma processing apparatus 100, which has been described above with reference to FIGS. 1A, 1B, 2, 3A, 3B, and 4.

Figure 6A:
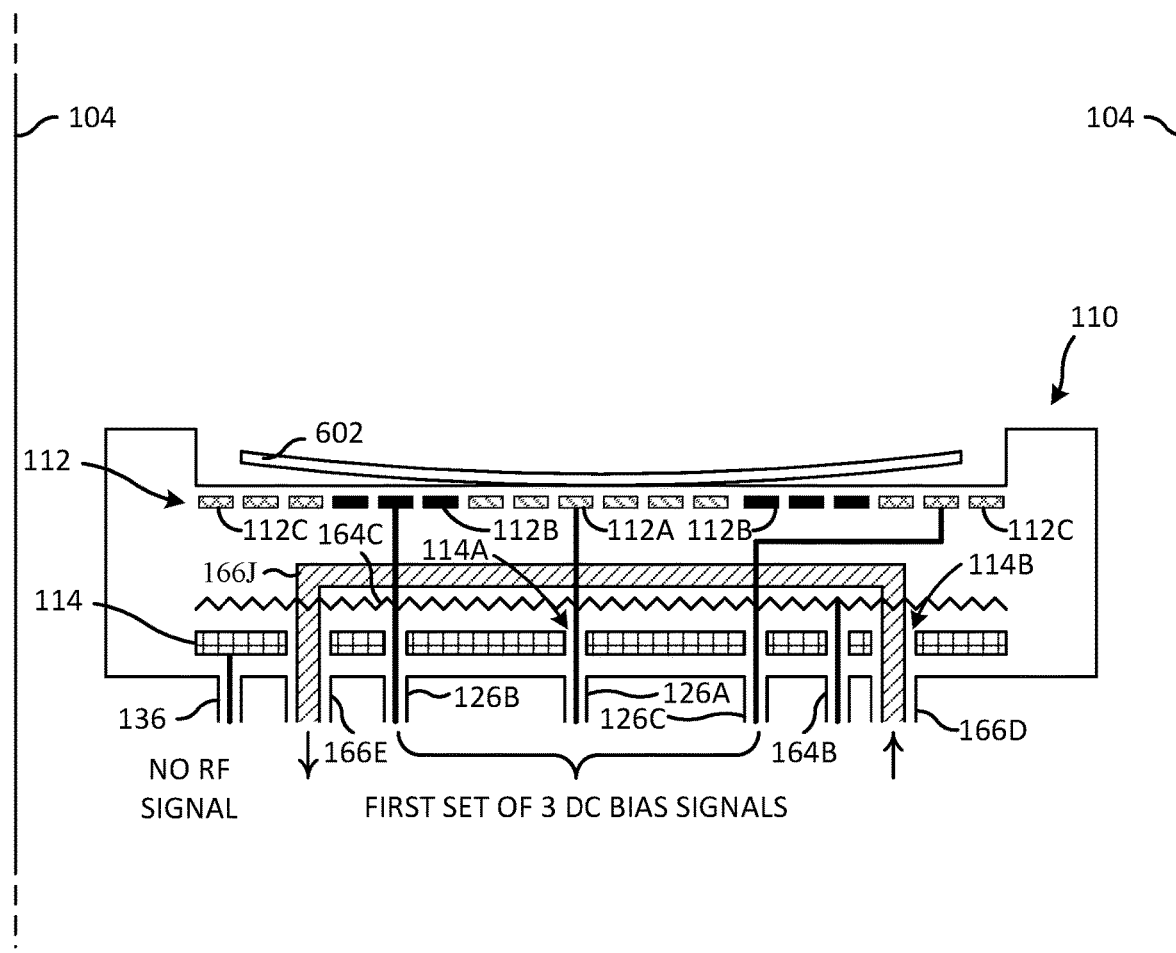
FIGS. 6A-6D illustrate cross-sectional views of an electrostatic chuck and a workpiece at various stages of operation of a plasma processing apparatus using the method illustrated in FIG. 5.

As indicated in box 502 in the flowchart of the method 500 and in the cross-sectional view in FIG. 6A, the incoming workpiece 602 is placed over the top surface of the ESC 110, where the ESC 110 is disposed in a plasma processing chamber 104. As mentioned in the background section, process-induced stress from previously completed process steps may cause the semiconductor wafer to have a bow. In this example, the incoming workpiece 602 is such a wafer, which has bent concavely upward, as illustrated in FIG. 6A. It is noted that, as illustrated in the cross-sectional view of the ESC 110 in FIG. 6A, the incoming workpiece 602 is placed over a slightly recessed portion of the top surface of the ESC 110 to help the surface to retain bent or warped semiconductor wafers.

Figure 5:
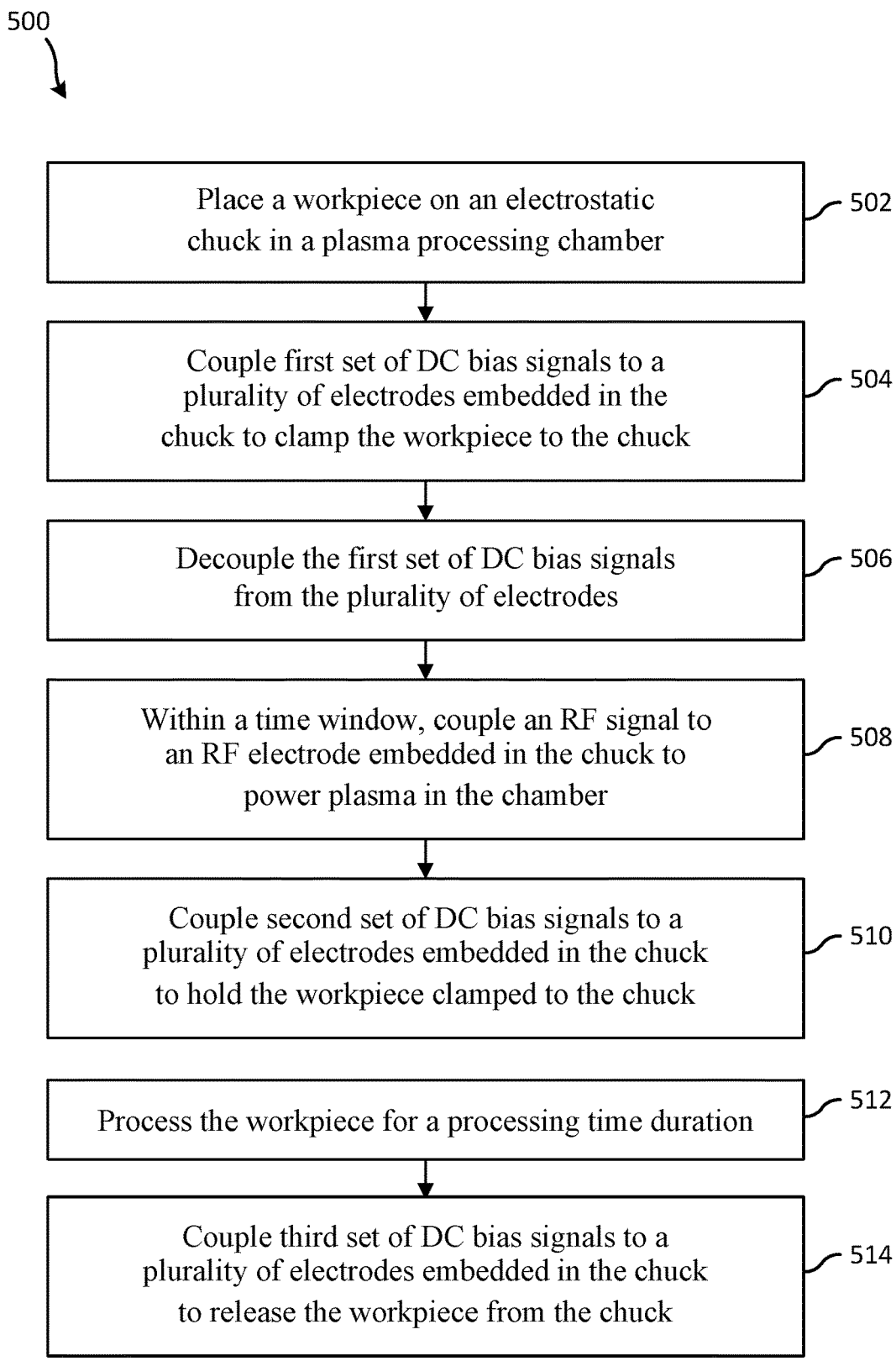
FIG. 5 illustrates a flowchart of a method of operation of a plasma processing apparatus, in accordance with some embodiment.

In FIG. 6A and as indicated in box 504 in FIG. 5, after the workpiece 602 has been loaded in the plasma processing chamber 104 and placed on the ESC 110, a first set of DC bias signals generated from the first power supply circuit 120 (see FIG. 1A) is applied to the respective zones of the plurality of electrodes 112 using synchronized control signals from the controller 138 (see FIG. 1A). At this juncture, there is no RF signal from the second power supply circuit 130 coupled to the RF electrode 114. As described above with reference to FIG. 1A, the controller 138 synchronously operates the first power supply circuit 120 and the second power supply circuit 130.

As described above, the plurality of electrodes 112 in the example ESC 110 has three zones, which are the central zone 112A, the intermediate zone 112B, and the edge zone 112C. Accordingly, each set of DC bias signals has three DC bias signals. The three DC bias signals pass through the electrical feedthroughs 126A, 126B, and 126C in the bottom surface of the ESC 110. As described above with reference to FIG. 1A, the signal waveforms in the set of DC bias signals may be tailored by the control circuit 124 in the first power supply circuit 120. For example, the first set of DC bias signals may be timed to clamp the concavely bowed workpiece 602 radially outwards from center to edge. Each DC bias signal in the first set may be a pulse comprising a rising edge, a pulse width, and a voltage level. In this example method 500, the DC bias signal to the central zone 112A may have the longest pulse width, with an appropriate voltage level applied first. Next, after a delay time, the rising edge of the DC bias signal to the intermediate zone 112B may bias the respective electrodes to a voltage level greater in magnitude than the voltage applied to the electrodes of the central zone 112A. Then, after another delay, the edge zone 112C may be biased by its DC bias signal, which may be the pulse with the shortest pulse width but the largest pulse height. Increasing the magnitude of the bias level in this manner may be desired because a vertical gap between the backside of the bent workpiece 602 and the top surface of the ESC 110 increases with increasing lateral distance from the center of the workpiece 602.

As indicated in box 506 of the flowchart in FIG. 5, after the workpiece 602 has been clamped to the supporting top surface of the ESC 110 with a desired flatness, the first set of DC bias signals is decoupled from the plurality of electrodes 112. The decoupling may be initiated by control signals from the controller 138 (see FIG. 1A). It is not desirable to have high voltage DC bias signals at the plurality of electrodes 112 when plasma is ignited in the plasma processing chamber 104 to avoid unwanted arcing. Accordingly, in FIG. 6B, there is no RF signal passing through the RF feedthrough 136 and no DC bias signal passing through any of the electrical feedthroughs 126A, 126B, and 126C of the ESC 110. Since the first set of DC bias signals have been decoupled, after the decoupling, there is a finite time window for the RF signal to ignite plasma in the plasma processing chamber 104. The time window, within which the RF signal travels from the second power supply circuit 130, through the RF feedthrough 136, and couples to the RF electrode 114 of the ESC 110 to power the plasma, may be between 1 millisecond to 10 seconds, depending on cable lengths and charging time constants involved in decoupling the DC bias signals and coupling the RF signal.

Figure 6B:
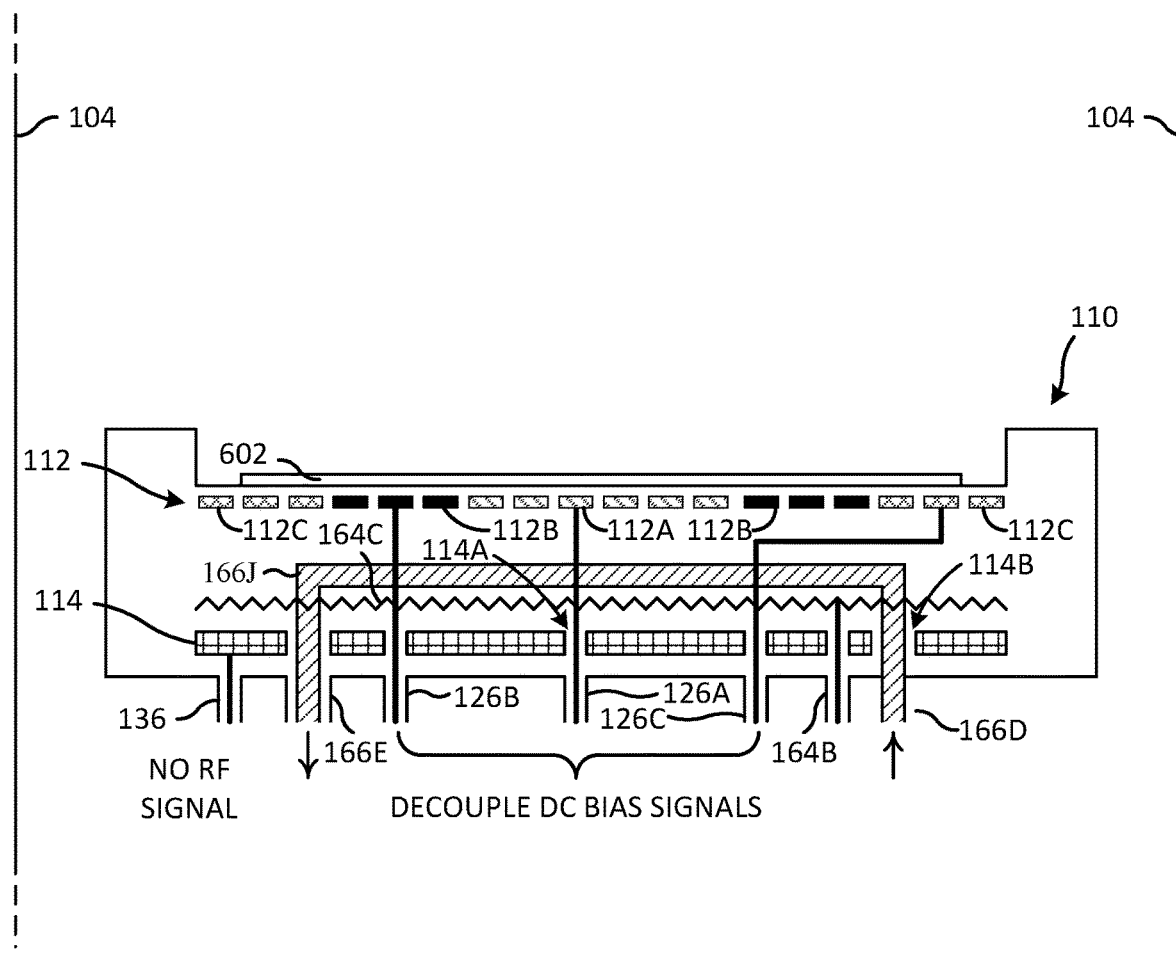
Figure 6C:
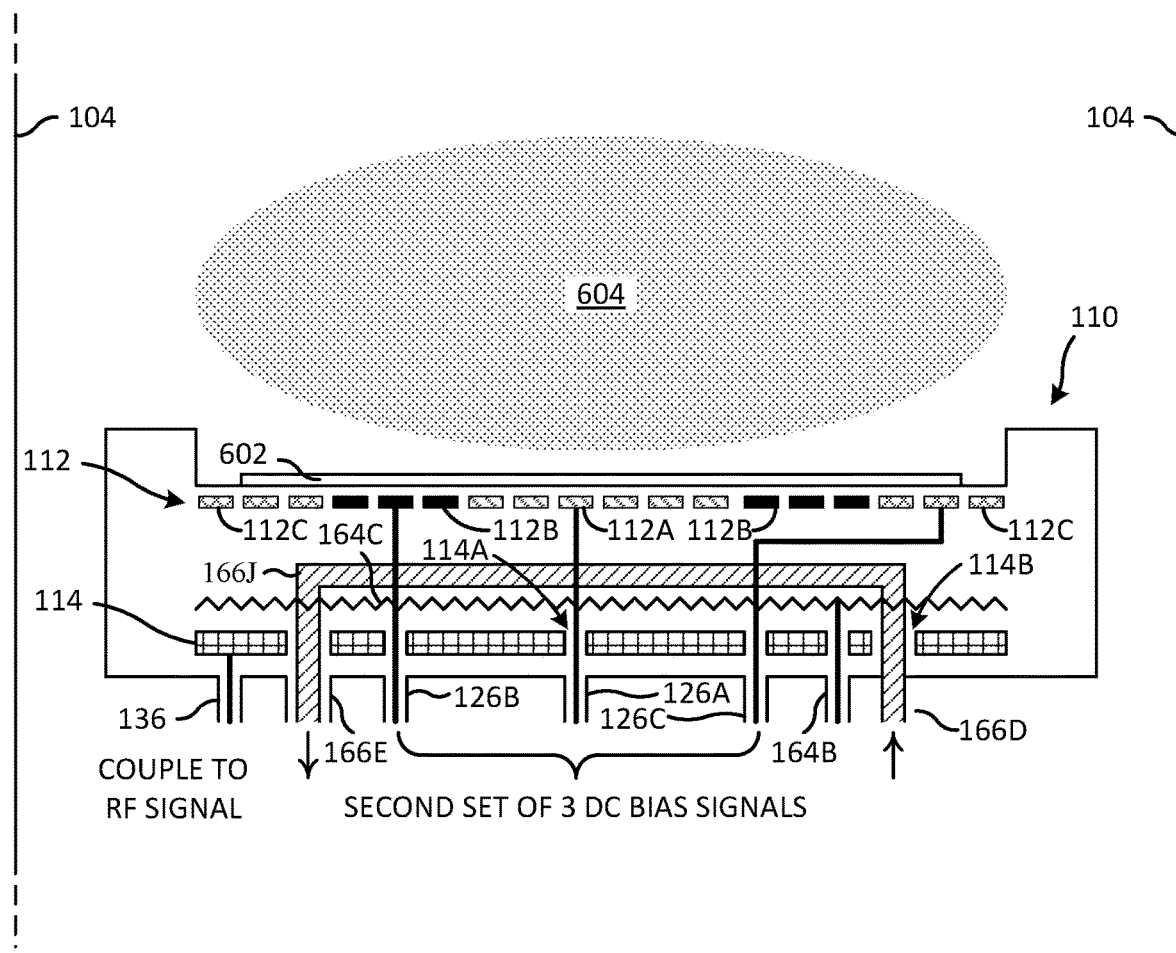

Next, within the prescribed time window, the controller 138 sends synchronized control signals to couple the RF signal from the second power supply circuit 130 to the RF electrode 114 to ignite and power plasma in the chamber 104, as indicated in box 508 of the method 500. FIG. 6C illustrates a cross-sectional view of the ESC 110 after plasma 604 has been ignited in the plasma processing chamber 104. As indicated in box 510 of the method 500, a second set of three DC bias signals is coupled to the plurality of electrodes 112, as shown in FIG. 6C. With the bent wafer (the workpiece 602 in FIG. 6A) already clamped flat (as seen in FIG. 6B), the second set of DC bias signals has to hold the workpiece 602 clamped to the ESC 110 during plasma processing. During the plasma operation, the ESC 110 acquires negative charge from a flux of free electrons present in the chamber. Generally, the chuck is negatively charged roughly uniformly, exerting a roughly uniform gripping force on the substrate 602, instead of multipolar operates with switching charges locally. Thus, it is reasonable to have all the DC bias signals of the second set of DC bias signals to be identical. As explained above with reference to FIG. 1A, this is equivalent to changing the plurality of electrodes 112 to be in a monopolar configuration.

In some embodiments, where another RF electrode is available outside the ESC 110, for example, the separate RF electrode 140 described above with reference to FIG. 1B, there is an option of decoupling the RF signal to the RF electrode 114 embedded in the ESC 110 after igniting and stabilizing the plasma 604 in the chamber 104. An RF signal has to be coupled, for example, to the separate RF electrode 140 to power the plasma 604 prior to decoupling the RF signal to the RF electrode 114. The plasma 604 may then be sustained with RF power from the separate RF electrode 140. In some embodiments, which use the option of decoupling the RF signal to the RF electrode 114 embedded in the ESC 110 after igniting and stabilizing the plasma 604 in the chamber 104, the decoupling of the RF signal may be done prior to coupling the second set of DC bias signals to the plurality of electrodes.

After the plasma 604 has been generated, the workpiece 602 is processed in the plasma processing chamber 104 for a processing time duration, as indicated in box 512 of the method 500. As illustrated in FIG. 6C, during this time, the workpiece is held by the second set of DC bias signals. In the example method 500, the RF signal to the RF electrode 114 is not decoupled from the ESC 110 after the RF signal is used to power the plasma 604 in the chamber 104. As shown in FIG. 6C, both the RF electrode 114 and the plurality of electrodes 112 are powered by the RF signal and the second set of DC bias signals, respectively while the workpiece 602 is processed by exposing it to plasma 604. As described above, the thermal system 160 (see FIGS. 1A and 1B) comprising the heater 164C, the liquid coolant passageways 166J, the gas passageway 166H for the backside gas, and the temperature controller 162 may be operated to control the temperature of the workpiece during processing.

At the end of the processing time duration, with the workpiece 602 having completed being processed, the plasma 604 may be extinguished. As indicated in box 514 in the flowchart of the method 500 illustrated in FIG. 5 and in the cross-sectional view of the ESC 110 in FIG. 6D, after processing the workpiece 602, a third set of DC bias signals may be coupled to the plurality of electrodes 112 to release the workpiece 602 from the ESC 110.

Figure 6D:
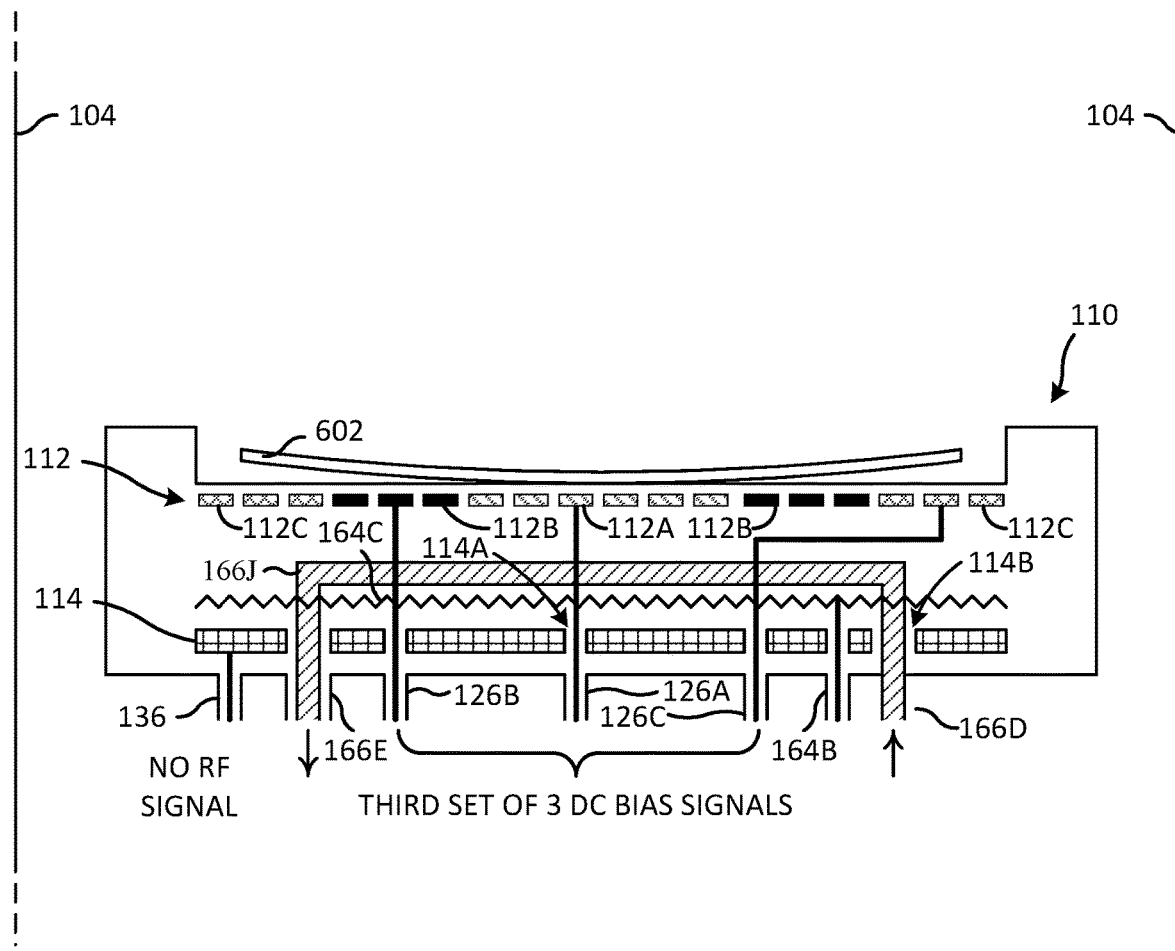

Since the workpiece 602 (a semiconductor wafer) was initially bent concavely upwards, the strain in the flattened workpiece 602 (after clamping with the first set of DC bias signals) may be higher towards the edge relative to the center. Thus, the third set of DC bias signals may be implementing a release sequence of pulses that releases the workpiece 602 in a sequence opposite to that used in the first set of DC bias signals used for clamping the workpiece 602. In other words, as mentioned above, the timing of the pulses in the third set of DC bias signals may be timed to release the workpiece starting from the edge region inward to the central region. The released workpiece 602, in FIG. 6D, is bent concavely upwards, similar to the bow of the incoming workpiece 602 in FIG. 6A.

In this disclosure we have described embodiments of electrostatic chucks and methods of operation, where the chuck combines a plurality of electrodes in a multipolar configuration with an RF electrode in a monolithic insulating substrate. This provides the advantages of clamping and declamping a bent/warped semiconductor wafer (the workpiece) in a plasma processing chamber, powering plasma in the chamber, and processing the workpiece at a temperature controlled in a wide range including extreme temperatures as high as 600° C.

Example embodiments of the invention are described below. Other embodiments can also be understood from the entirety of the specification as well as the claims filed herein.

Example 1. An electrostatic chuck (ESC) for holding a workpiece in a plasma processing chamber, where the ESC includes a monolithic insulating substrate with a top surface; a plurality of electrodes embedded in the insulating substrate, the plurality of electrodes being in a multipolar configuration to receive multiple DC bias signals from a first power supply circuit; and a radio frequency (RF) electrode embedded in the insulating substrate, the plurality of electrodes being located between the top surface and the RF electrode, the RF electrode including a contact node configured to be coupled to a second power supply circuit configured to generate an RF signal.

Example 2. The ESC of example 1, where the plurality of electrodes is located in a first plane at a first distance from the top surface, and where the RF electrode is located at a second distance from the top surface, the second distance being greater than the first distance.

Example 3. The ESC of one of examples 1 or 2, where the first distance is between 0.5 mm and 5 mm, and where a difference between the second distance and the first distance is between 0.25 mm and 10 cm.

Example 4. The ESC of one of examples 1 to 3, further including passageways in the monolithic insulating substrate for flowing fluid through the ESC.

Example 5. The ESC of one of examples 1 to 4, where a passageway of the passageways is through an opening in the RF electrode.

Example 6. The ESC of one of examples 1 to 5, where, in the multipolar configuration, the plurality of electrodes are divided into a plurality of zones, the electrodes in each zone of the plurality of zones being insulated from the other zones and coupled to a separate DC terminal of the plurality of electrodes, where the separate DC terminal is configured to be coupled to the first power supply circuit configured to generate one of the multiple DC bias signals.

Example 7. The ESC of one of examples 1 to 6, where the RF electrode is thicker than each electrode of the plurality of electrodes.

Example 8. The ESC of one of examples 1 to 7, where the plurality of electrodes is not located in a single plane at a fixed distance from the top surface.

Example 9. The ESC of one of examples 1 to 8, where the electrodes of the plurality of electrodes, from a top view, are shaped like concentric rings or portions of a spiral.

Example 10. An apparatus for plasma processing a workpiece, where the apparatus includes a plasma processing chamber mechanically coupled to a gas flow system configured to flow gas through the chamber; an electrostatic chuck (ESC) disposed in the chamber, the ESC including: a monolithic insulating substrate with a top surface; a plurality of electrodes embedded in the insulating substrate, in a multipolar configuration to receive multiple DC bias signals; and a radio frequency (RF) electrode embedded in the insulating substrate, the plurality of electrodes being located between the top surface and the RF electrode; a first power supply circuit configured to supply multiple DC bias signals to the plurality of electrodes, the plurality of electrodes being coupled to the first power supply circuit; and a second power supply circuit configured to supply an RF signal to the RF electrode, the RF electrode being coupled to a second power supply circuit.

Example 11. The apparatus of example 10, further including: an RF connector disposed in the ESC and coupled to the RF electrode; a plurality of electrical connectors disposed in the ESC and coupled to the plurality of electrodes; and insulated feedthroughs in the RF electrode, the plurality of electrical connectors passing through the insulated feedthroughs.

Example 12. The apparatus of one of examples 10 or 11, where the first power supply circuit is configured to output a first set of DC bias signals for clamping the workpiece to the ESC after the workpiece is initially placed on the ESC, a second set of DC bias signals to hold the workpiece clamped to the ESC during plasma processing, and a third set of DC bias signals for releasing the workpiece from the ESC.

Example 13. The apparatus of one of examples 10 to 12, where the second power supply circuit includes a matching circuit configured to output the RF signal that is impedance matched to a load impedance at an output.

Example 14. The apparatus of one of examples 10 to 13, further including a controller configured to synchronously operate the first power supply circuit and the second power supply circuit.

Example 15. The apparatus of one of examples 10 to 14, where the ESC further includes: a heater disposed in the monolithic insulating substrate; an electrical conductor coupled to the heater; and passageways, for a cooling fluid, disposed in the monolithic insulating substrate.

Example 16. The apparatus of one of examples 10 to 15, where the electrical conductor passes through an insulated feedthrough in the RF electrode.

Example 17. The apparatus of one of examples 10 to 16, further including an RF electrode disposed outside the ESC, the RF electrode being configured to couple RF power to plasma in the chamber.

Example 18. A method for plasma processing a workpiece in a plasma processing chamber, where the method includes placing a workpiece on an electrostatic chuck (ESC) disposed in the chamber; coupling a first set of DC bias signals to a plurality of electrodes embedded in the ESC in a multipolar configuration, the first set clamping the workpiece to the ESC; after clamping the workpiece to the ESC, decoupling the first set of DC bias signals from the plurality of electrodes; within a time window after decoupling the first set of DC bias signals, coupling a radio frequency (RF) signal to an RF electrode embedded in the ESC, the RF signal powering plasma in the chamber; after powering plasma in the chamber, coupling a second set of DC bias signals to the plurality of electrodes, the second set holding the workpiece clamped to the ESC; processing the workpiece in the chamber for a processing time duration; and after processing the workpiece, coupling third set of DC bias signals to the plurality of electrodes, the third set releasing the workpiece from the ESC.

Example 19. The method of example 18, where the time window is between one millisecond and ten seconds after decoupling the first set of DC bias signals.

Example 20. The method of one of examples 18 or 19, where all the DC bias signals of the second set of DC bias signals are identical.

Example 21. The method of one of examples 18 to 20, further including: prior to coupling the second set of DC bias signals to the plurality of electrodes, decoupling the RF signal to the RF electrode embedded in the ESC; and prior to decoupling the RF signal to the RF electrode embedded in the ESC; powering the plasma with an RF signal coupled to an RF electrode outside the ESC.

Example 22. The method of one of examples 18 to 21, further including forming the ESC, the forming including: forming a monolithic insulating substrate by embedding a plurality of electrodes in the insulating substrate and embedding an RF electrode in the insulating substrate.

Example 23. The method of one of examples 18 to 22, further including: processing the workpiece, controlling a temperature of the workpiece with a thermal system, the temperature being in a range from −150° C. to 1000° C., the thermal system including: a heater disposed in the ESC; passageways in the ESC for flowing fluid through the ESC; and a temperature controller controlling operation of the thermal system.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for plasma processing a workpiece in a plasma processing chamber, the method comprising:
   placing a workpiece on an electrostatic chuck (ESC) disposed in the chamber;
   coupling a first set of DC bias signals to a plurality of electrodes embedded in the ESC in a multipolar configuration, the first set of DC bias signals clamping the workpiece to the ESC;
   after clamping the workpiece to the ESC, decoupling the first set of DC bias signals from the plurality of electrodes;
   within a time window after decoupling the first set of DC bias signals, coupling a radio frequency (RF) signal to an RF electrode embedded in the ESC, the RF signal powering plasma in the chamber;
   after powering plasma in the chamber, coupling a second set of DC bias signals to the plurality of electrodes, the second set holding the workpiece clamped to the ESC;
   processing the workpiece in the chamber for a processing time duration; and
   after processing the workpiece, coupling third set of DC bias signals to the plurality of electrodes, the third set releasing the workpiece from the ESC.

2. The method of claim 1, wherein the time window is between one millisecond and ten seconds after decoupling the first set of DC bias signals.

3. The method of claim 1, wherein all the DC bias signals of the second set of DC bias signals are identical.

4. The method of claim 1, further comprising:
   prior to coupling the second set of DC bias signals to the plurality of electrodes, decoupling the RF signal from the RF electrode embedded in the ESC; and
   prior to decoupling the RF signal to the RF electrode embedded in the ESC; powering the plasma with an RF signal coupled to an RF electrode outside the ESC.

5. The method of claim 1, further comprising forming the ESC, the forming comprising:
   forming a monolithic insulating substrate by embedding a plurality of electrodes in the insulating substrate and embedding an RF electrode in the insulating substrate.

6. The method of claim 1, further comprising:
   processing the workpiece, controlling a temperature of the workpiece with a thermal system, the temperature being in a range from −150° C. to 1000° C., the thermal system comprising:
   a heater disposed in the ESC;
   passageways in the ESC for flowing fluid through the ESC; and
   a temperature controller controlling operation of the thermal system.

7. A method for plasma processing a workpiece in a plasma processing chamber, the method comprising:
   placing a workpiece on an electrostatic chuck (ESC) disposed in the chamber, the ESC comprising a monolithic insulating substrate with a top surface;
   clamping the workpiece to the ESC, the clamping comprising coupling a first power supply circuit to a plurality of electrodes embedded in the insulating substrate in a multipolar configuration;
   after clamping the workpiece to the ESC, decoupling the first power supply circuit from the plurality of electrodes; and
   within a time window after decoupling the first power supply circuit, coupling a second power supply circuit to an RF electrode embedded in the ESC so as to generate an RF signal at the RF electrode, the RF signal powering plasma in the chamber, the plurality of electrodes being located between the top surface and the RF electrode.

8. The method of claim 7, further comprising:
   positioning the plurality of electrodes in a first plane at a first distance from the top surface, and
   positioning the RF electrode at a second distance from the top surface, the second distance being greater than the first distance.

9. A method for plasma processing a workpiece in a plasma processing chamber, the method comprising:
   placing a workpiece on an electrostatic chuck (ESC) disposed in the chamber, the ESC comprising a monolithic insulating substrate with a top surface;
   coupling a first power supply circuit to a plurality of electrodes embedded in the insulating substrate in a multipolar configuration to receive multiple DC bias signals, the plurality of electrodes being located between the top surface and an RF electrode and supplying the multiple DC bias signals to the plurality of electrodes, a first set of the multiple DC bias signals clamping the workpiece to the ESC;
   after clamping the workpiece to the ESC, decoupling the first power supply circuit from the plurality of electrodes;
   within a time window after decoupling the a first power supply circuit, coupling a second power supply circuit supplying an RF signal to the RF electrode; and
   supplying a second set of the multiple DC bias signals to the plurality of electrodes to release the workpiece from the ESC.

10. The method of claim 9, further comprising:
    coupling an RF connector disposed in the ESC to the RF electrode; and coupling a plurality of electrical connectors disposed in the ESC to the plurality of electrodes, the plurality of electrical connectors passing through insulated feedthroughs.

11. The method of claim 9, further comprising outputting, at the first power supply circuit,
   a first set of DC bias signals for clamping the workpiece to the ESC after the workpiece is initially placed on the ESC,
   a second set of DC bias signals for releasing the workpiece from the ESC, and
   a third set of DC bias signals to hold the workpiece clamped to the ESC during plasma processing.

12. The method of claim 9, further comprising outputting, at a matching circuit in the second power supply circuit, the RF signal that is impedance matched to a load impedance at an output.

13. The method of claim 9, further comprising synchronously operating the first power supply circuit and the second power supply circuit.

14. The method of claim 9, wherein the ESC further comprises:
   a heater disposed in the monolithic insulating substrate;
   an electrical conductor coupled to the heater, wherein the electrical conductor passes through an insulated feedthrough in the RF electrode; and
   passageways, for a cooling fluid, disposed in the monolithic insulating substrate.

* * * * *